United States Patent
Ho

(10) Patent No.: US 7,907,407 B2
(45) Date of Patent: Mar. 15, 2011

(54) HEAT DISSIPATING DEVICE

(75) Inventor: Tsung-Te Ho, LuChu Township, TaoYuan County (TW)

(73) Assignee: Chidae Electronics Co., Ltd., TaoYuan (TW)

( * ) Notice: Subject to any disclaimer, the term of this patent is extended or adjusted under 35 U.S.C. 154(b) by 0 days.

(21) Appl. No.: 12/081,271

(22) Filed: Apr. 14, 2008

(65) Prior Publication Data

US 2009/0257193 A1 Oct. 15, 2009

(51) Int. Cl.
*H05K 7/20* (2006.01)

(52) U.S. Cl. ........ 361/700; 361/704; 361/719; 361/720; 165/104.33; 257/715

(58) Field of Classification Search .................. 361/695, 361/697, 700, 704, 707, 709, 710, 719, 720
See application file for complete search history.

(56) References Cited

U.S. PATENT DOCUMENTS

| | | | |
|---|---|---|---|
| 6,487,076 B1 * | 11/2002 | Wang ............................. | 361/697 |
| 6,871,702 B2 * | 3/2005 | Horng et al. ............. | 165/104.33 |
| 7,343,962 B2 * | 3/2008 | Xia et al. ..................... | 165/80.3 |
| 7,365,989 B2 * | 4/2008 | Peng et al. .................... | 361/720 |
| 7,414,850 B2 * | 8/2008 | Hung ............................ | 361/719 |
| 7,551,442 B2 * | 6/2009 | Stefanoski .................... | 361/700 |
| 2007/0131383 A1 * | 6/2007 | Hattori et al. ................ | 165/11.2 |
| 2007/0211432 A1 | 9/2007 | Peng et al. | |
| 2008/0158820 A1 * | 7/2008 | Peng et al. .................... | 361/703 |

* cited by examiner

*Primary Examiner* — Jayprakash N Gandhi
*Assistant Examiner* — Courtney Smith

(57) ABSTRACT

A heat dissipating device is designed with calm, efficient, and space economy performance includes a housing (1) having an exhaust (10), and an intake (32). A fan (4) disposed inside the housing (1) is relative to the intake (32). A set of fins (10) disposed inside the housing (1) is relative to the exhaust (10). Said fan (4) is rotated to circulate cooling air into the set of fins (6), and expel hot air absorbed by the fins out of the exhaust. A first heat pipe (5) is disposed on an inner wall of the housing (1) relative to the fan (4). The first heat pipe (5) has a condensing portion at one end encircles most of the fan; an evaporating portion at the other end extends to the inner wall of the housing, where a heat-generating electronic component is located, is thermally connected to the set of fins (6).

4 Claims, 12 Drawing Sheets

HEAT DISSIPATING DEVICE

FIELD OF THE INVENTION

The present invention is related to a heat dissipating device applied to communication products.

BACKGROUND OF THE INVENTION

When new communication products promoted on the market, motto of Moore's Law: "double performance every 18 months" still under consideration by either customers or manufacturers. However, to meet those requirements, those communication products invoke better performance result in more power consumption and more heat generated and must be dissipated to ambient environment, otherwise the electronic component may slow down speedy performance.

Person skilled in the art have provided conventional heat dissipating device, as illustrated in FIG. 1, usually equipped with a fan rotated to circulate cooling air into fins to disperse heat absorbed by the fins.

The conventional heat dissipating device includes a housing (7) having a planar base (71), and a cover (72). A plurality of fins (8) are disposed on the base (71) inside the housing (7); a thermal conductor (81) disposed on the base (71) is further placed below the set of fins (8). Two heat pipes (80a, 80b) thermally connected to the thermal conductor (81) by bottom ends, but being inserted into the set of fins (8) by top ends. And, a fan (9) disposed inside the housing (7) is relative to the set of fins (8). As the conventional heat dissipating device is assembled integrally as whole, the communication product, for example, a graphic processing unit (GPU) of video graphic assays (VGA) card disposed adjacent to the housing (1). Heat generated by the communication product is transferred through the thermal conductor (81), the heat pipes (80a, 80b) to the set of fins (8). And the fan (9) circulates cooling air into the set of fins (8) to expel hot air out of an exhaust (10). Thus a temperature can be lowered to achieve a cooling effect. The communication product can be operated not to be overheated by the generated heat.

Furthermore, published US 20070211432 entitled "heat dissipating device for computer add-on card" to Xue-Wen Peng on Sep. 13, 2007 (hereinafter Peng) proposed that a heat pipe connected between a set of fins and a base. The heat pipe has an evaporating portion placed above a heat-generating GPU of VGA, and a condensing portion distant from the GPU of VGA but thermally connected to the set of fins.

As above, heat dissipating devices of FIG. 1 and Peng have some drawbacks as following:

1. The thermal conductor (81) of FIG. 1 dissipates heat via the two heat pipes (80a, 80b) to the set of fins (8), and then the fan (9) circulates cooling air into the fins (8) to disperse heat. Therefore, two heat pipes (80a, 80b) and the fins (8) lower temperature as the fan is rotated to circulate cool air into the fins. But Peng provided an evaporating portion (of a heat pipe), which is thermally connected to a heat-generating GPU of VGA, and a condensing portion (of the heat pipe) is kept distant from the GPU of VGA but thermally connected to the set of fins. Also the fan is rotated to circulate cooling air into the fins for dissipating heat.

As above, temperature may be lowered, but restricted to a limited scope, how to dissipate heat more efficiently for the communication products is expected by the invention.

2. To achieve a cooling effect, a fan must be rotated speedily, but more power consumed and more noise inducted. How to save power and reduce noise is further expected by the invention.

3. Either the two heat pipes of FIG. 1 or the heat pipe of Peng restricted to a limited cooling effect, which may not conform to new standards for the communication products. Therefore, the set of fins must be expanded with a larger surface or a huge body readily for dissipating heat. As a result, the enlarged heat dissipating device is incompatible with communication products.

How to provide a heat dissipating device can disperse more heat within a limited space is concerned by the invention.

SUMMARY OF THE INVENTION

The present invention is to provide a compact heat dissipating device can lower temperature efficiently with reduced noise.

A heat dissipating device includes a housing (1) is formed with an exhaust (10) and an intake (33); a fan (4) disposed inside the housing (1) is corresponding to the intake (33); a set of fins (6) disposed inside the housing (1) is corresponding to the exhaust (10); said fan (4) is rotated to circulate cooling air into the set of fins (6) and expel hot air absorbed by the fins (6) from the exhaust (10); wherein an inner wall of the housing (1) is installed with a first heat pipe (5), one end of the heat pipe (5) is a condensing portion to encircle the fan (4), the other end of the heat pipe (5) is an evaporating portion to extend to an inner wall of the housing (1), where a heat-generating electric component (40) is located, is thermally connected to the set of fins (6).

Aforementioned housing (1) is composed of a base (1), and a cover (3) relative to the base (1); the exhaust (10) is formed on the other end of the housing (1), the intake (33) is formed on one end of the housing (1); where a fan (4) is located; further a pair of cambered slots (20) correspondingly formed below the fan (4).

Further, wherein an inner wall of the base (2) has a channel (21) accommodates the first heat pipe (5) embedded into the channel (21); or an inner wall of the cover (3) has a channel (31) accommodates the first heat pipe (5) embedded into the channel (31).

Said condensing portion of the first heat pipe (5) encircled most of the fan (4) is shaped as a cambered heat pipe portion (51), while said evaporating portion integrally combined to said condensing portion as a whole, the evaporating portion is shaped as a rectilinear heat pipe portion (52); which is thermally connected between the heat-generating electronic component adjacent to the inner wall of the housing (1) and the set of fins (6); said channels (21, 31) have cambered portions (21a, 31a) respectively corresponding to the cambered heat pipe portion (51), said channels (21, 31) also have rectilinear portions (21b, 31b) respectively corresponding to the rectilinear heat pipe portion (52).

Said heat pipe (5) is an elongated vacuum metal pipe filled with working fluid, which is distilled water.

Moreover, a central portion of the housing relative to the heat-generating electronic component formed with a groove (23) accommodates said thermal conductor (11) embedded in the groove (23), said thermal conductor (11) is thermally connected to said first heat pipe (5); said thermal conductor (11) is made of copper plate.

Moreover, a second heat pipe (5') thermally connected between said set of fins (6) and the inner wall of the housing (1); an evaporating portion at one end of the second heat pipe (5') is shaped also as a rectilinear heat pipe portion (53) extended to the inner wall of the housing (1), where the heat-generating electronic component (40) is located; a condensing portion at the other end of the second heat pipe (5') is shaped as a spiral heat pipe portion (54) extended to said exhaust (10); said first, second heat pipes (5, 5') are shaped symmetrically in opposite to each other.

Furthermore, an inner wall of the base (2) has a channel (22) accommodates the first heat pipe (5') embedded into the channel (22); or an inner wall of the cover (3) has a channel (32) accommodates the first heat pipe (5') embedded into the channel (32).

Furthermore, a central portion of the housing (1) formed with a groove accommodates said thermal conductor (11) embedded into the groove, where a thermal conductor (11) is thermally connected between said first heat pipe (5) and said second heat pipe (5'); said thermal conductor (11) is made of copper plate.

Said first, second heat pipes (5, 5') are elongated vacuum metal pipes filled with working fluid, which is water.

Another embodiment of the present invention is realized by a heat dissipating device includes a housing (1) is formed with an exhaust (10) and an intake (33); a fan (4) disposed inside the housing (1) is corresponding to the intake (33); a set of fins (6) disposed inside the housing (1) is corresponding to the exhaust (10); said fan (4) is rotated to circulate cooling air into the set of fins (6) and expel hot air absorbed by the fins (6) from the exhaust (10); wherein an inner wall of the housing relative to the fan (4) is installed with a first heat pipe (5) with one end as one condensing portion encircles most of the fan (4) and the other end as the other condensing portion kept distant from the fan (4) and thermally connected to the set of fins (6); while a middle portion of the heat pipe (5) served as an evaporating portion is placed on the inner wall of the housing (1), where a heat-generating electronic component is located, the middle portion of the heat pipe (5) is also thermally connected to the set of fins (6).

A heat dissipating device as mentioned above, wherein said housing (1) consists of a base (2), and a cover (3) adapted to the base (2), an exhaust (10) is formed at the other end of the housing (1), an intake is formed at one end of the housing (1), a pair of cambered slots (20) formed through the base (2) are located below the fan (4); a channel (21) formed on an inner wall of said base (2) is corresponding to the heat pipe (5) and accommodates the first heat pipe (5) embedded into the base (2).

A heat dissipating device as mentioned above, wherein one condensing portion at one end of the first heat pipe (5) is a cambered heat pipe portion (51) encircles most of the fan (4), the other condensing portion at the other end of the first heat pipe (5) is one rectilinear heat pipe portion (56) kept distant away from the fan (4), while said evaporating portion is the other rectilinear heat pipe portion (52) integrally connected to said cambered heat pipe portion (51), the other rectilinear heat pipe portion (52) is thermally connected to the heat-generating electronic component adjacent to the inner wall of the housing (1) and thermally connected to the set of fins (6); said channel (21) has a cambered channel portion (21a) corresponding to said cambered heat pipe portion (51), and one rectilinear channel portion (21b) corresponding to one rectilinear heat pipe portion (52) and the other rectilinear channel portion (21c) corresponding to the other heat pipe portion (56).

A heat dissipating device as mentioned above, wherein a groove (23) formed on said base (2) accommodates a thermal conductor (11) embedded into the base (2), said thermal conductor (11) is thermally connected between said evaporating portion of the first heat pipe (5) and the heat-generating electronic component; said thermal conductor (11) is made of copper plate.

DETAILED DESCRIPTION OF THE PREFERRED EMBODIMENTS OF THE INVENTION

The description is described in detail according to the appended drawings hereinafter.

First Embodiment

Figure 1:
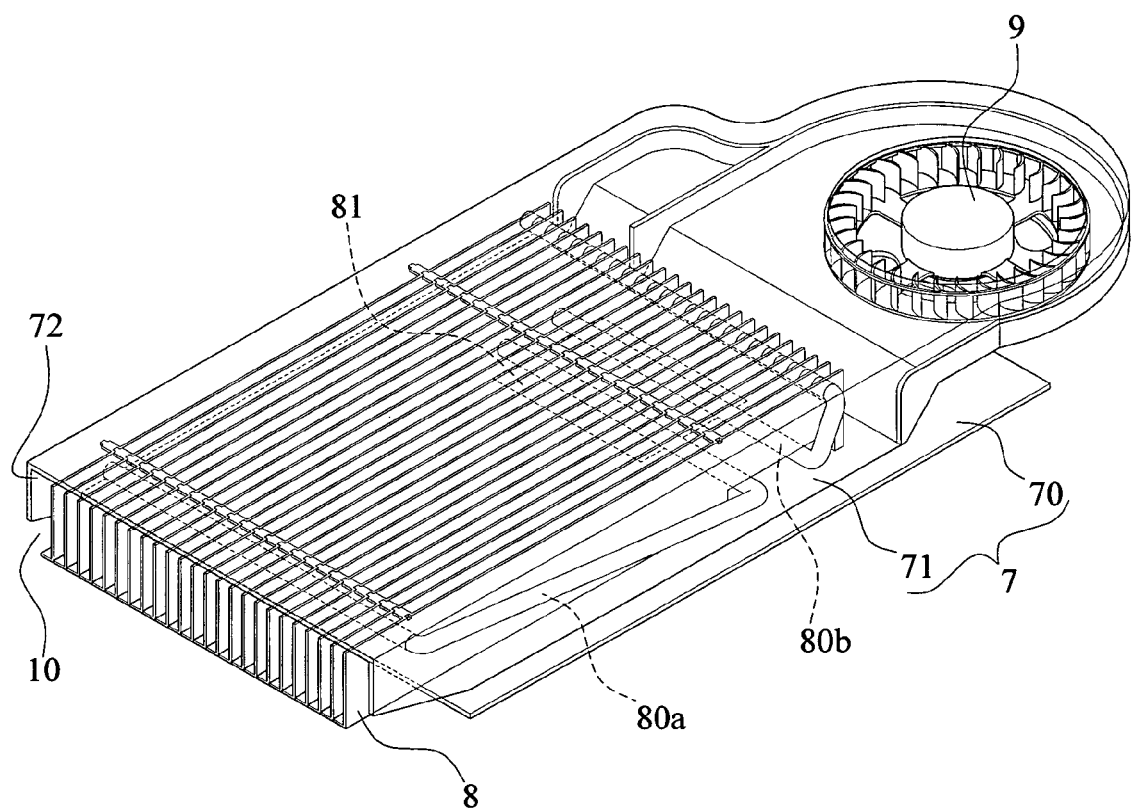
FIG. 1: is a schematic view of conventional heat dissipating device.
Figure 2:
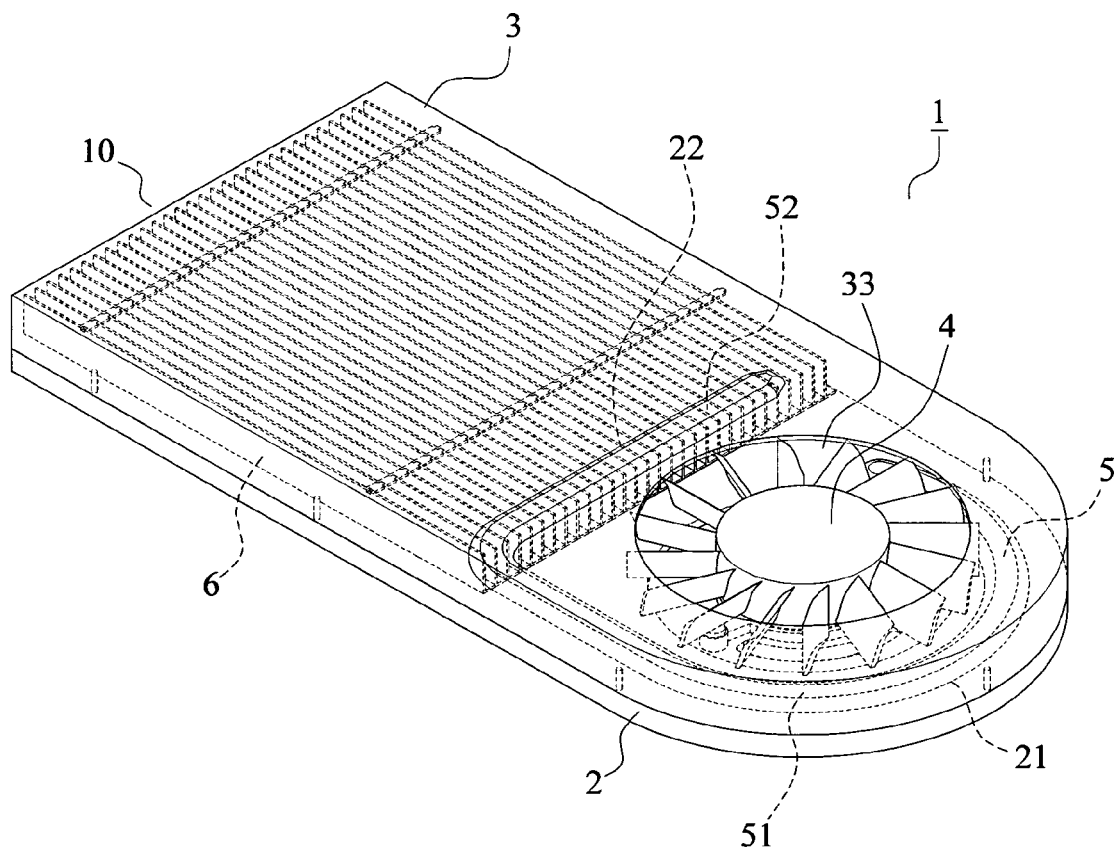
FIG. 2: is an assembled view of a first embodiment of the heat dissipating device of the invention.
Figure 3:
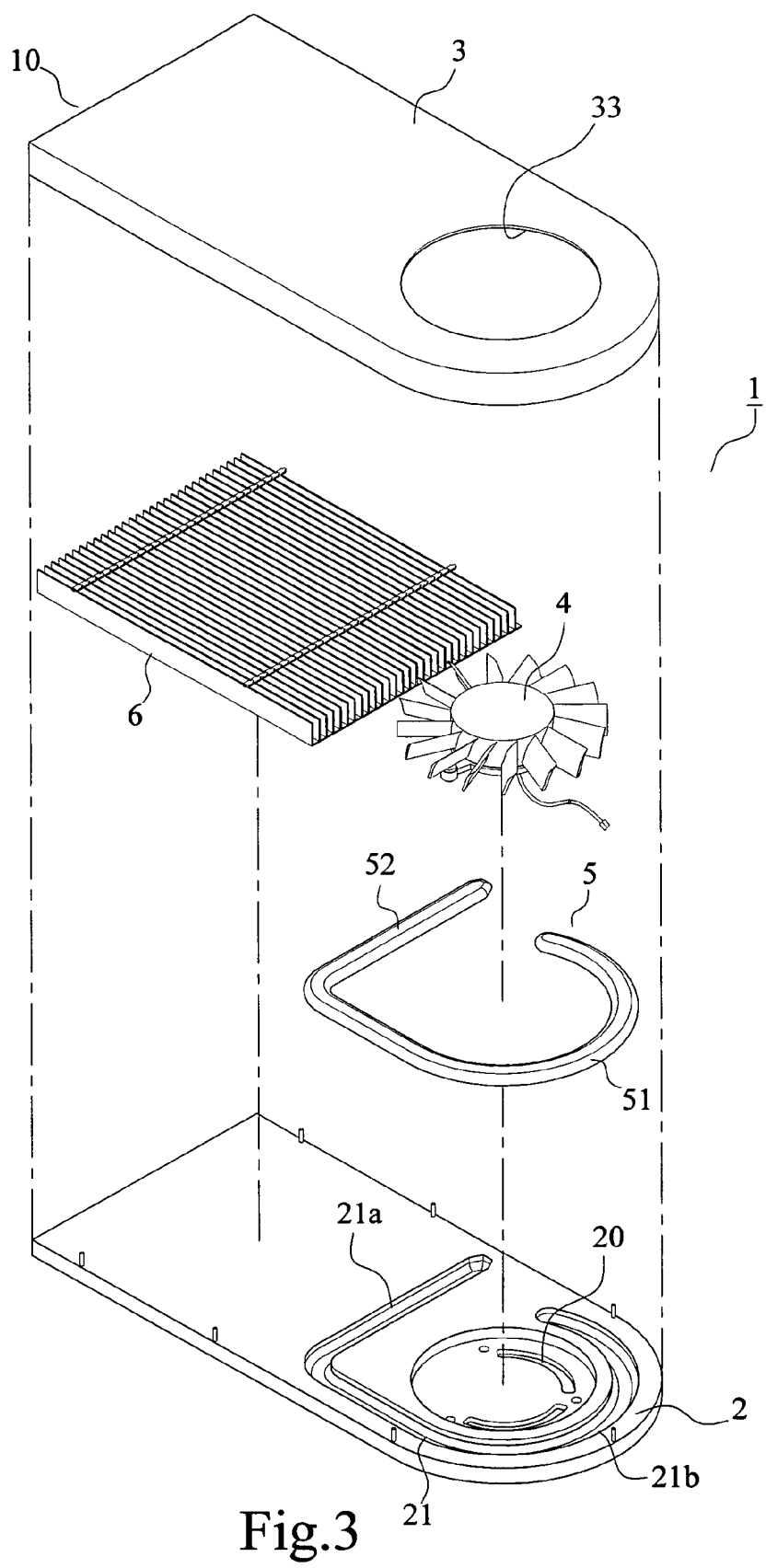
FIG. 3: is an exploded view of FIG. 2.
Figure 4:
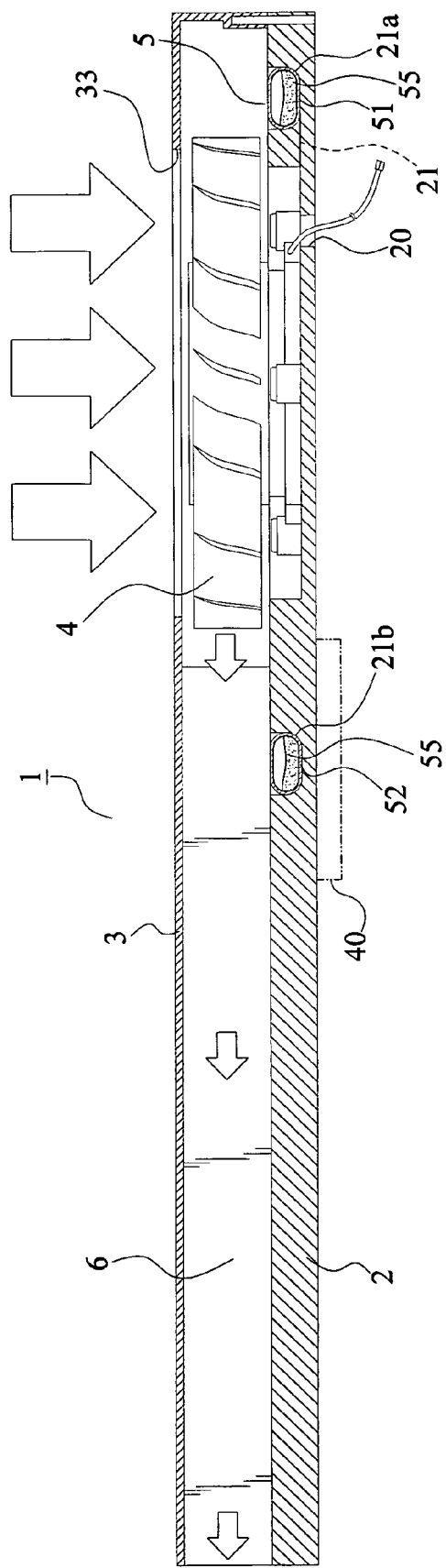
FIG. 4: is a sectional view of FIG. 2.

As shown in FIGS. 2~4, a heat dissipating device includes a housing (1) has an intake (33), and an exhaust (10). A fan (4) disposed inside the housing (1) is corresponding to the intake (33). A set of fins (6) disposed inside the housing (1) is corresponding to the exhaust (10). Said fan (4) is rotated to circulate cooling air into the set of fins (6) and expel hot air absorbed by the fins (6) out of the exhaust (10).

An inner wall of the housing (1) relative to the fan (4) is installed with a first heat pipe (5), one end of the heat pipe (5) is a condensing portion encircles most of the fan (4); the other end of the heat pipe (5) is an evaporating portion extends to the inner wall of the housing (1), where a heat-generating electronic component (40) is located, the evaporating portion is thermally connected to the set of fins (6).

Said evaporating portion of the heat pipe (5) is thermally connected to the heat-generating electronic component (40), but said condensing portion of the heat pipe (5) is kept distant from the heat-generating electronic component. When the evaporating portion transfers heat to the condensing portion; cool air blown by the fan (4) circulates inside the set of fins (6), where a temperature is lowered. In contrast to the cool air blown in the set of fins (6), hot air expelled out of the exhaust (10) is accompanied with heat release. Where about 90% heat released from the exhaust, but 10% heat released from air flow slots (20), which are cambered in shape in pair formed through a base (2) below the fan (4).

As above, the housing (1) is composed of the base (2), and a cover (3) relative to the base (2). The exhaust (10) is formed at the other end of the housing (1), while the intake (33) is formed at one end of the housing (1). Furthermore, the fan (4) is disposed adjacent to the intake (33), where the air flow slots (20) are further formed related to the fan (4). When the fan (4) is rotated, cool air can be circulated from the intake (33) through the set of fins (6) and then expelled out of the exhaust (10).

Inner wall of said base (2) has a channel (21) accommodates the first heat pipe (5) embedded into the channel (21), where the first heat pipe (5) is fixed in place without any movements.

Said condensing portion of said first heat pipe (5) encircles most of a perimeter of the fan (4) is shaped as a cambered heat pipe portion (51); while said evaporating portion is integrally connected to said cambered heat pipe portion (51) as a whole as a rectilinear heat pipe portion (52), which is connected to an inner wall of the housing (1), where the heat-generating electronic component is located. And the rectilinear heat pipe portion (52) is thermally connected to the set of fins (6). Said channel (21) has cambered channel portion (21a) corresponding to the cambered heat pipe portion (51); and rectilinear heat pipe portion (21b) corresponding to the rectilinear heat pipe portion (52).

Furthermore, said first heat pipe (5) is an elongated vacuum metal pipe filled with working fluid (55) for transferring heat. Said working fluid (55) is made of distilled water.

Second Embodiment

Figure 5:
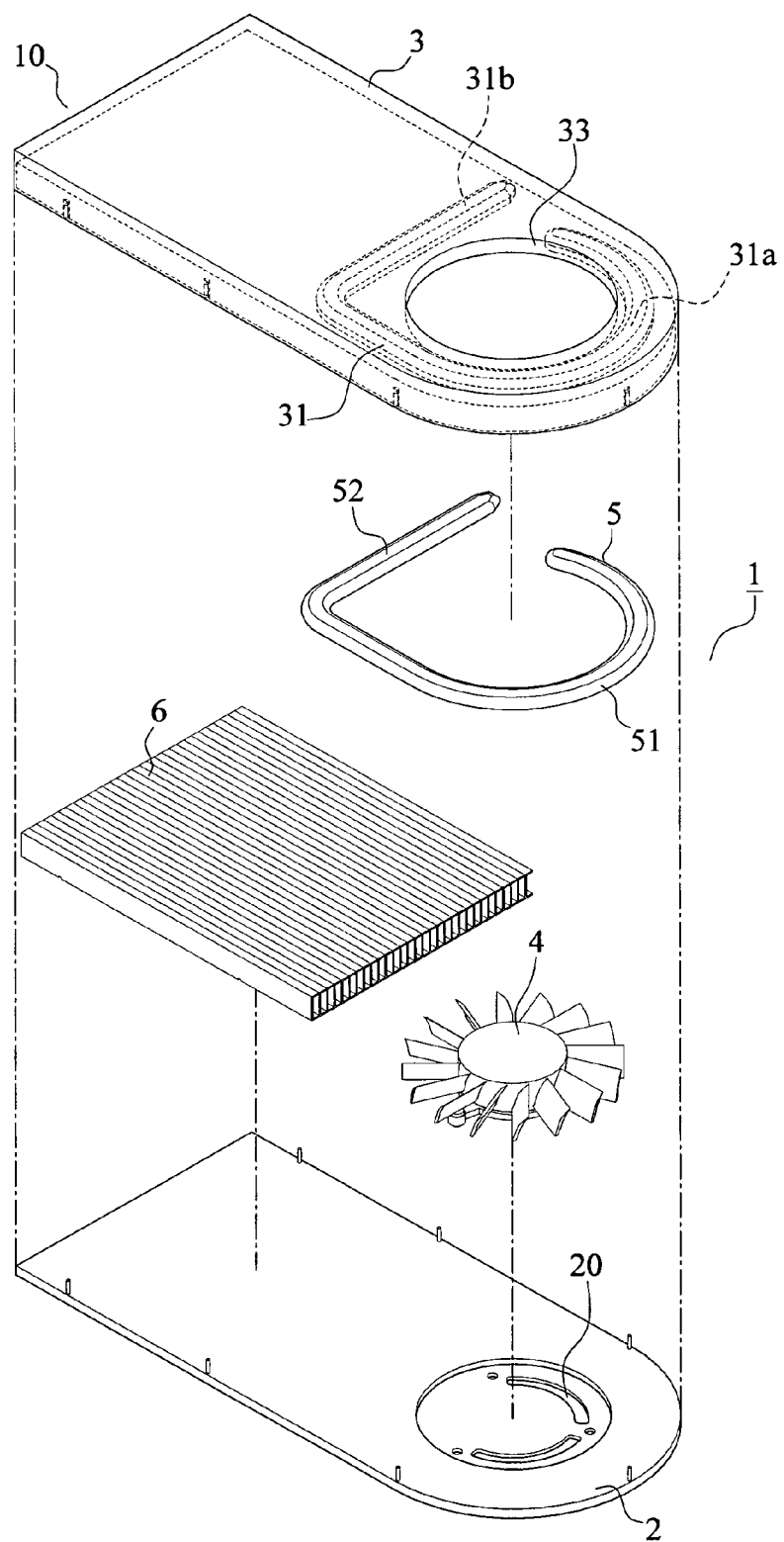
FIG. 5: is an exploded view of a second embodiment of the heat dissipating device of the invention.
Figure 6:
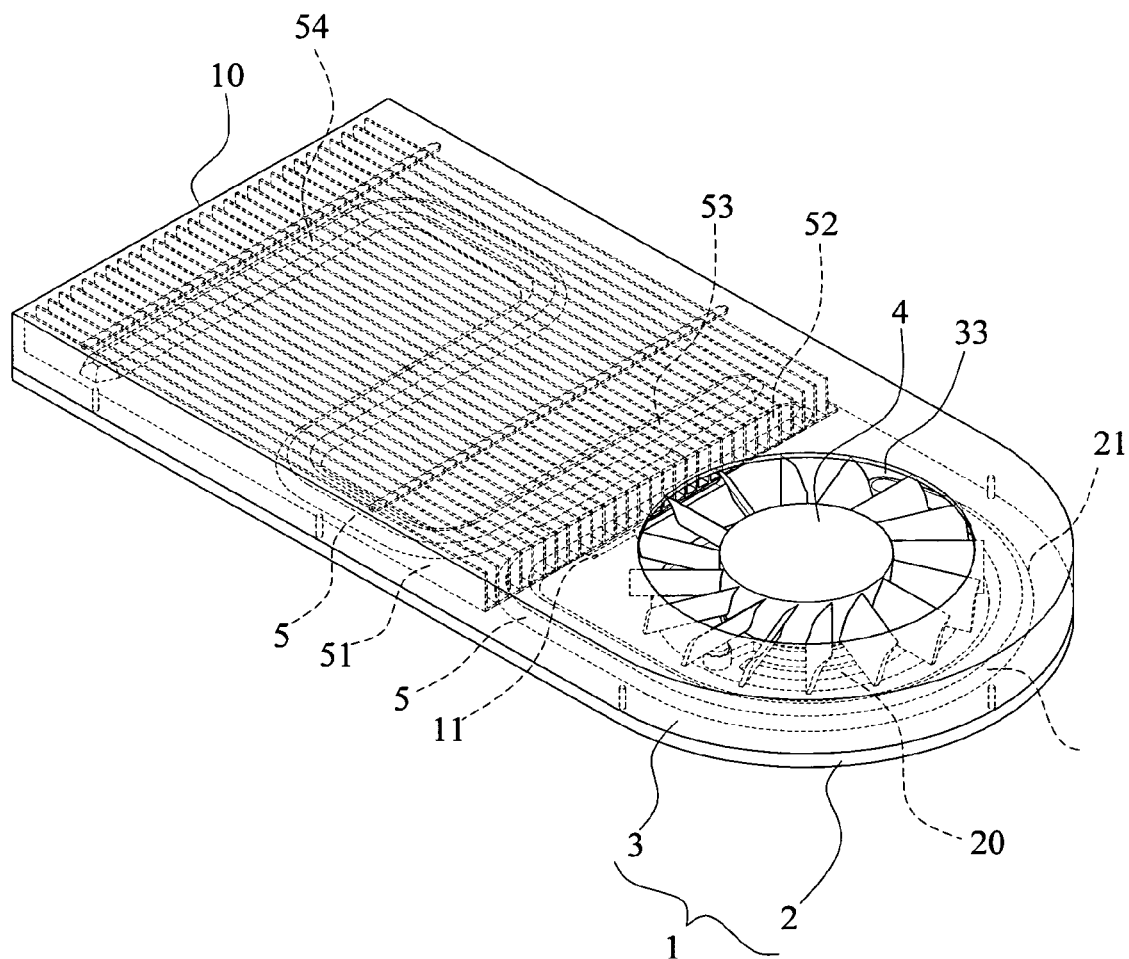
FIG. 6: is an assembled view of a third embodiment of the heat dissipating device of the invention.
Figure 7:
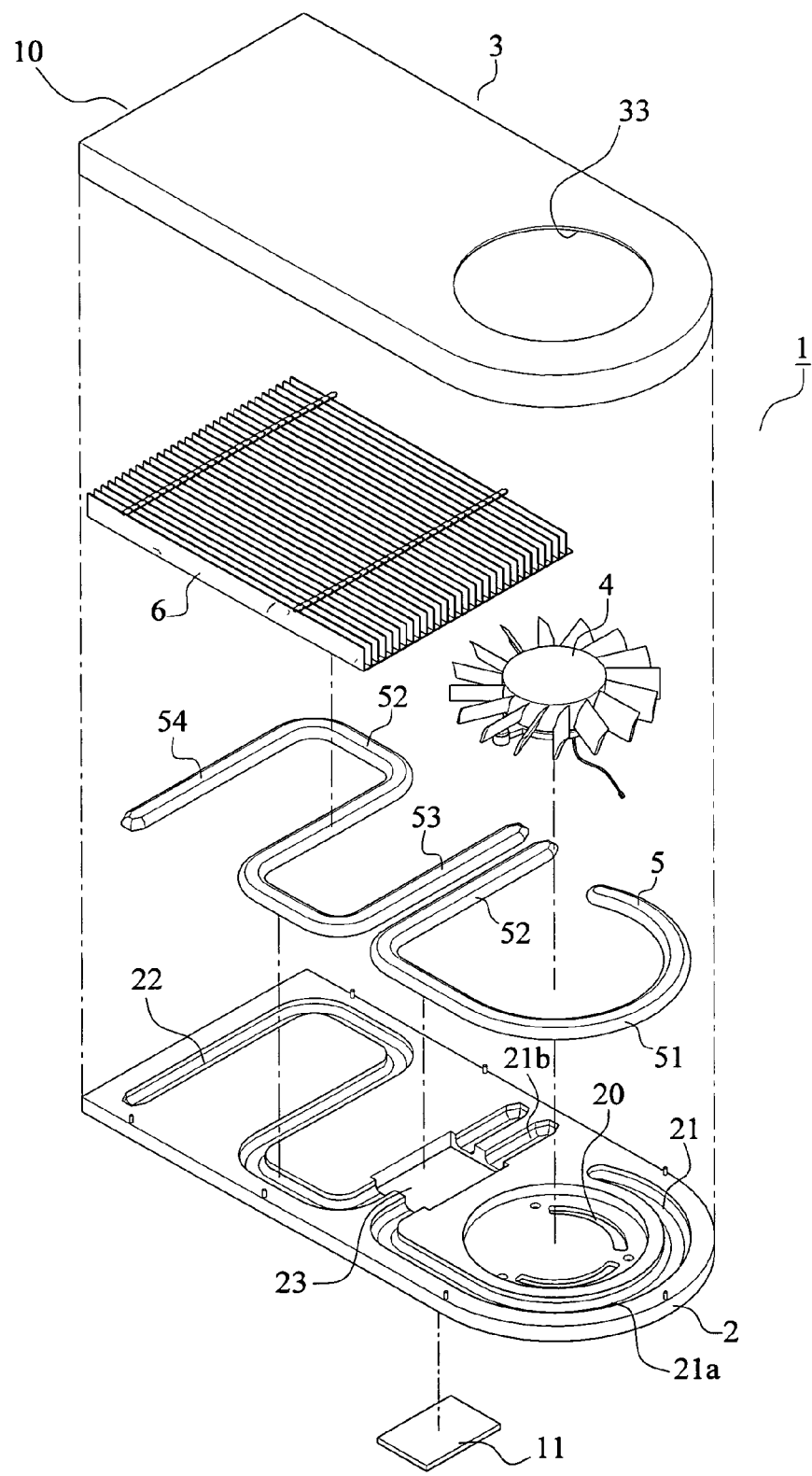
FIG. 7: is an exploded view of FIG. 6.
Figure 8:
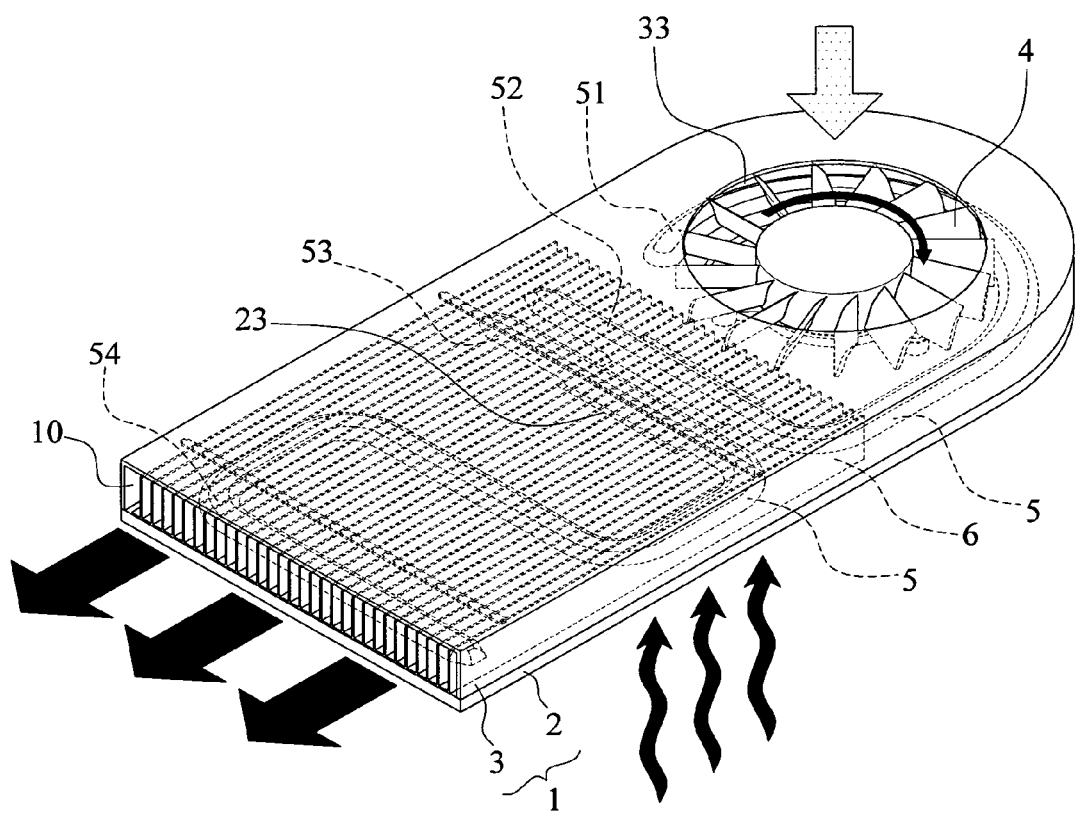
FIG. 8: is a schematic view of FIG. 6 in use.
Figure 9:
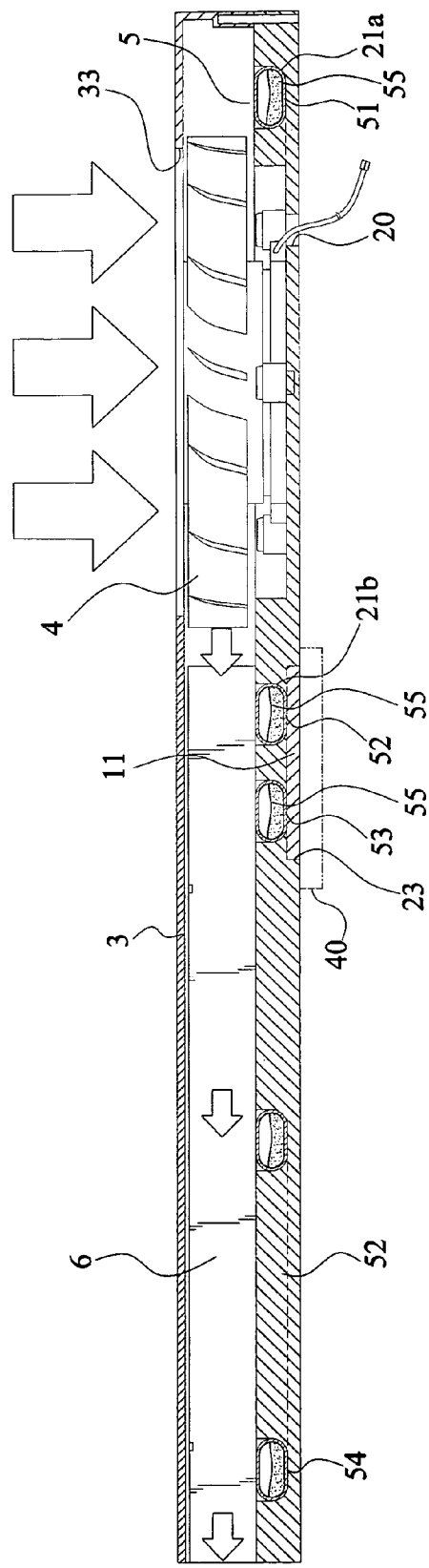
FIG. 9: is a sectional view of FIG. 6.

As shown in FIG. 5, an exploded view of a second embodiment of the present invention is illustrated. The second embodiment is different from the first embodiment by an inner wall of said cover (2) has a channel (31) accommodates the first heat pipe (5) embedded into the cover (3), where the first heat pipe (5) is fixed in place without any movements.

Said channel (31) has a cambered channel portion (31a) corresponding to the cambered heat pipe portion (51); and a rectilinear heat pipe portion (31b) corresponding to the rectilinear heat pipe portion (52).

Therefore, in the second embodiment, the first heat pipe (5) is located above the fan (4). But, in the first embodiment, the first heat pipe (5) is located below the fan (4).

Third Embodiment

As shown in FIGS. 6~9, a third embodiment of the present invention is illustrated. The third embodiment is different from the first embodiment by a second heat pipe (5') is disposed between the set of fins (6) and the inner wall of the housing (1). An evaporating portion is at one end of the second heat pipe (5'), the evaporating portion is shaped as a rectilinear heat pipe portion (53) extends to the housing (1), where the electronic component is located. A condensing portion is at the other end of the second heat pipe (5'), the condensing portion is shaped as a spiral heat pipe portion (54) extends to the exhaust (10) of the housing (1). Said first and second heat pipes (5, 5') are shaped symmetrically in opposite to each other.

Next, an inner wall of the base (2) has a channel (22) corresponding to the second heat pipe (5') and accommodates the second heat pipe (5') embedded into the channel (22). The second heat pipe (5') is therefore embedded into the channel (22) in place without any movements.

Furthermore, the base (2) installed with heat-generating electronic component is further formed a groove (23) accommodates a thermal conductor (11) embedded into the groove (23). Said thermal conductor (11) is thermally connected to the first, second heat pipes (5, 5'). Furthermore, said thermal conductor (11) is made of copper plate for conducting heat properly.

Said first, second heat pipes (5, 5') are elongated vacuum metal pipes filled with working fluid (55) for transferring heat promptly. And the working fluid is water.

Fourth Embodiment

Figure 10:
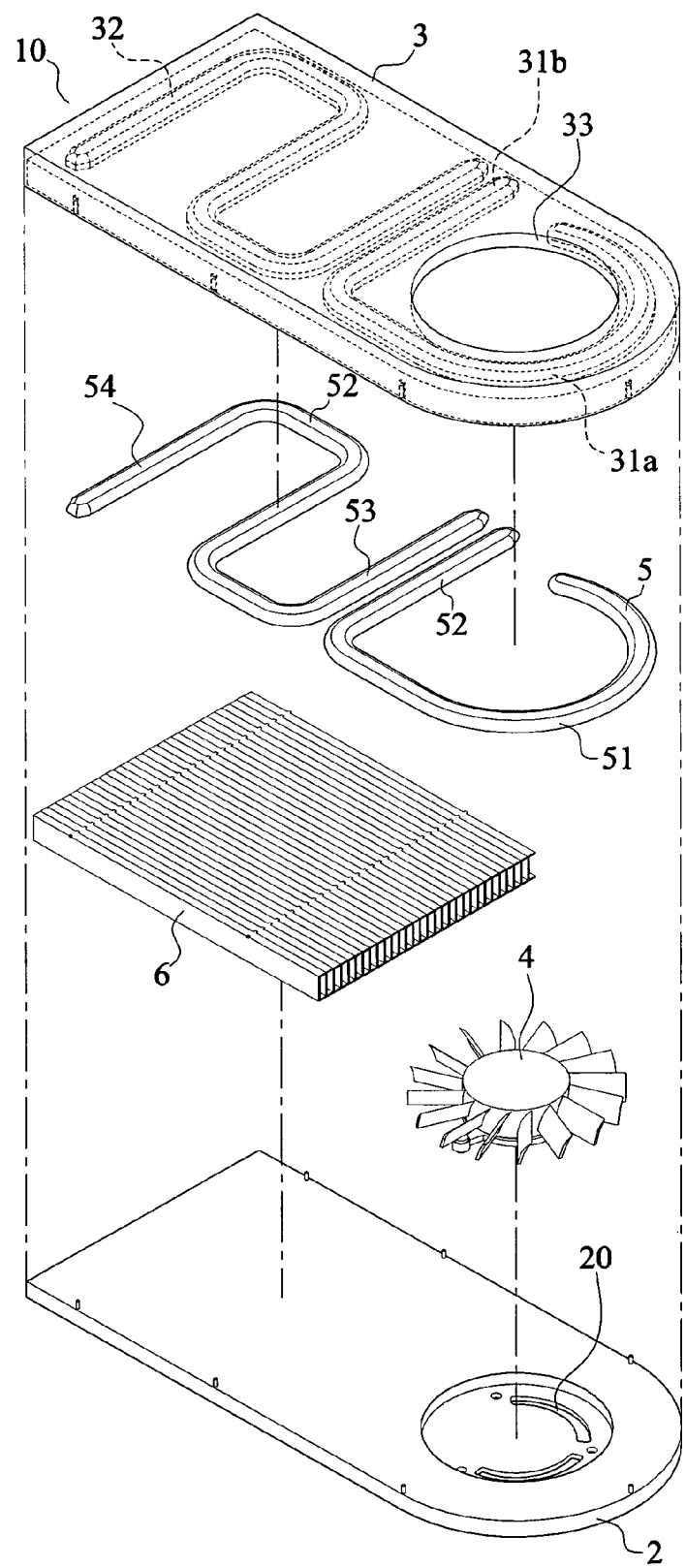
FIG. 10: is an exploded view of a fourth embodiment of the heat dissipating device of the invention.

As shown in FIG. 10, an exploded view of the fourth embodiment is illustrated. The fourth embodiment is different from the third embodiment by a channel (32) formed on an inner wall of the cover (3). The channel (32) is corresponding to the second heat pipe (5') and accommodates the second heat pipe (5') embedded into the channel (32). Therefore, the second heat pipe (5') is located above the set of fins (6). But, in the third embodiment, the second heat pipe (5') is located below the set of fins (6).

The groove (23) of the base (2) of the third, fourth embodiments accommodates the thermal conductor (11) embedded into the groove (23). At the same time, the groove (23) of the base (11) also accommodates the thermal conductor (11) embedded into the groove (23). The thermal conductor (11) is thermally connected between the first heat pipe (5) and the heat-generating electronic component (40).

Fifth Embodiment

Figure 11:
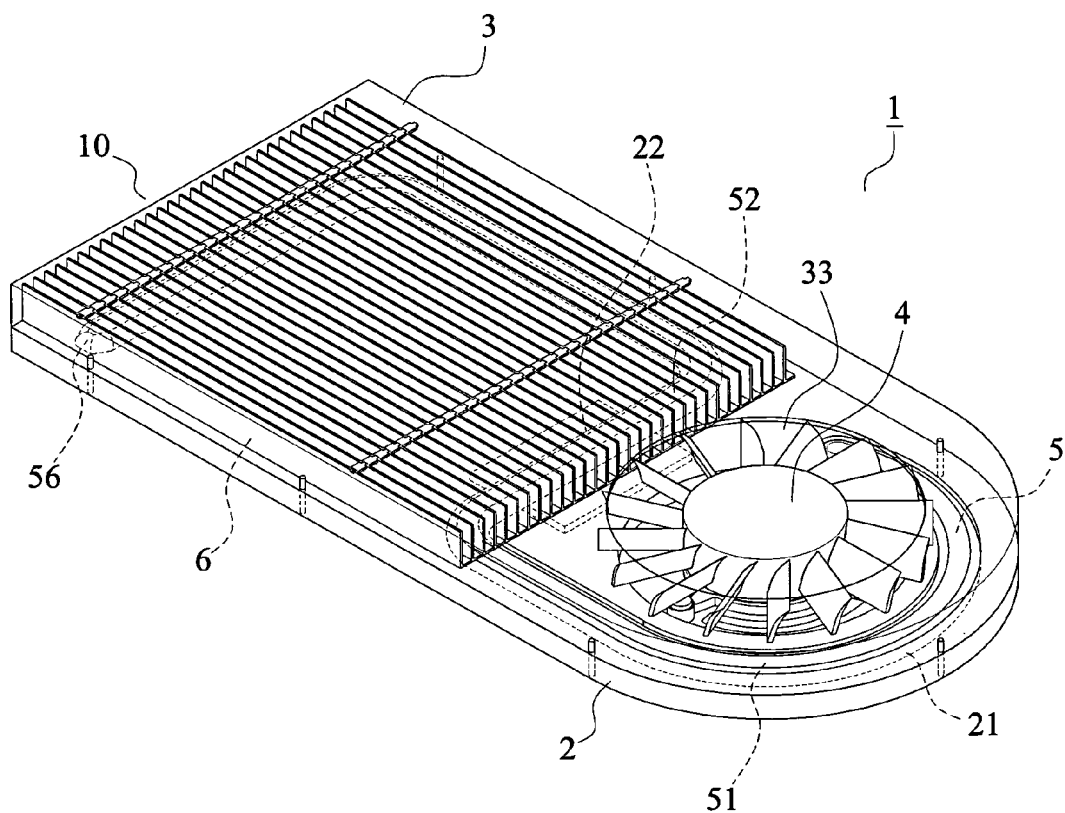
FIG. 11: is a perspective view of a fifth embodiment of the heat dissipating device of the invention.
Figure 12:
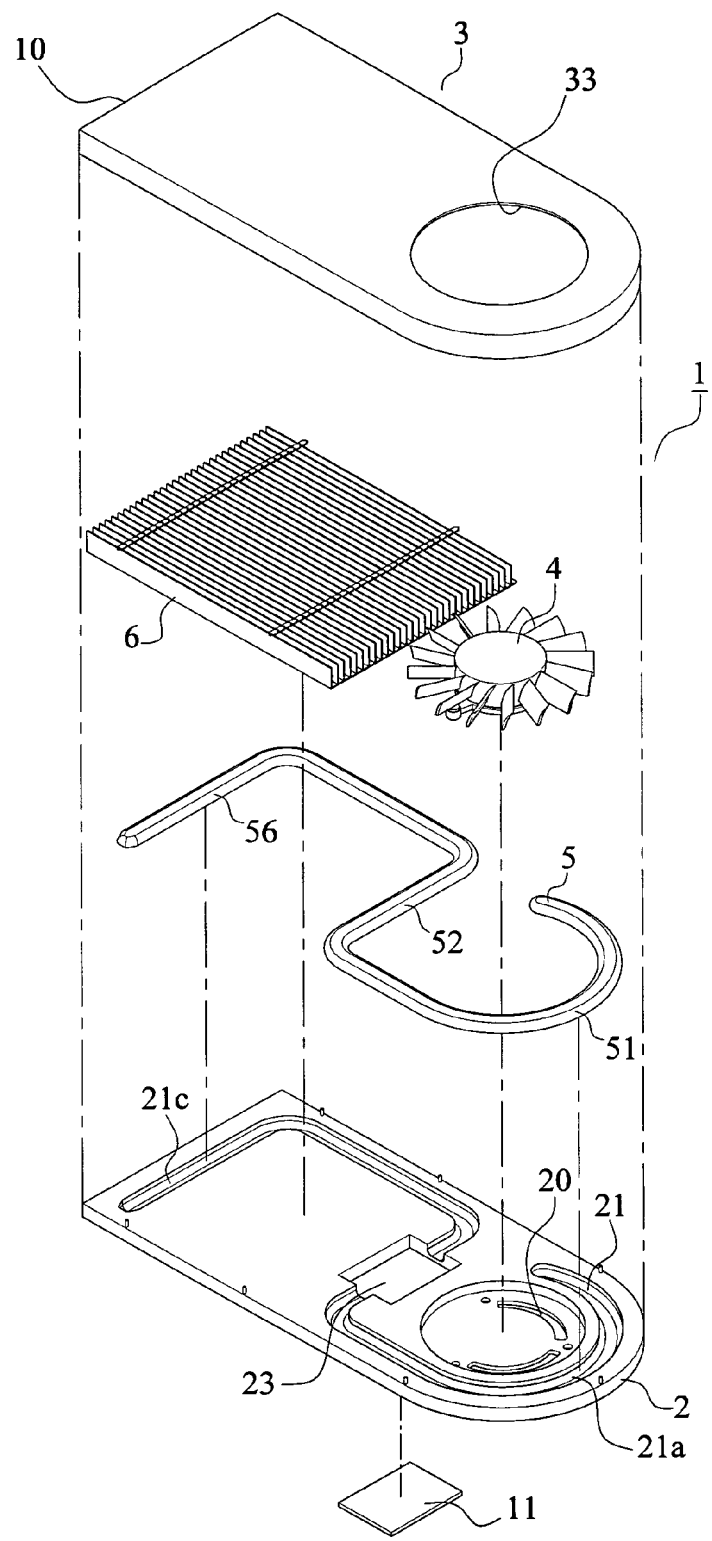
FIG. 12: is an exploded view of FIG. 11.

As shown in FIGS. 11~12, a heat dissipating device includes a housing (1) is formed with an exhaust (10) and an intake (33); a fan (4) disposed inside the housing (1) is corresponding to the intake (33); a set of fins (6) disposed inside the housing (1) is corresponding to the exhaust (10); said fan (4) is rotated to circulate cooling air into the set of fins (6) and expel hot air absorbed by the fins (6) from the exhaust (10); wherein an inner wall of the housing relative to the fan (4) is installed with a first heat pipe (5) with one end as one condensing portion encircles most of the fan (4) and the other end as the other condensing portion kept distant from the fan (4) and thermally connected to the set of fins (6); while a middle portion of the heat pipe (5) in the middle of both condensing portions as an evaporating portion is placed on the inner wall of the housing (1), where a heat-generating electronic component is located, the middle portion of the heat pipe (5) is also thermally connected to the set of fins (6).

As above, when said middle portion as the evaporating portion transfers heat to both ends, while one condensing portion at one end of the first heat pipe (5) encircles most of perimeter of the fan (4), which circulates cooling air into one condensing portion to lower temperature, while part of heat transferred to the other condensing portion at the other end of the first heat pipe (5), which is not only kept distant away from the fan (4), but also cooling air circulated by the fan (4) is blown through the other condensing portion to carry away the heat out of an exhaust (10). On the whole, heat release can be performed rapidly to lower temperature of the heat generating electronic component and to reduce noise.

Said housing (1) consists of a base (2), and a cover (3) adapted to the base (2), the exhaust (10) is formed at the other end of the housing (1), an intake is formed at one end of the housing (1), a pair of cambered slots (20) formed through the base (2) are located below the fan (4); a channel (21) formed on an inner wall of said base (2) is corresponding to the heat pipe (5) and accommodates the first heat pipe (5) embedded into the base (2). When the fan (4) is rotated to circulate cooling air from the intake (33) through the set of fins (6) and then expel hot air out of the exhaust (10). The cambered slots (20) can flow out par of cooling air further to blow to the base (2). By the channel (21), the first heat pipe (5) can be fixed stably without any movements.

One condensing portion at one end of the first heat pipe (5) is a cambered heat pipe portion (51) encircles most of the fan (4), the other condensing portion at the other end of the first heat pipe (5) is one rectilinear heat pipe portion (56) kept distant away from the fan (4), while said evaporating portion is the other rectilinear heat pipe portion (52) integrally connected to said cambered heat pipe portion (51), the other rectilinear heat pipe portion (52) is thermally connected to the heat-generating electronic component adjacent to the inner wall of the housing (1) and thermally connected to the set of fins (6); said channel (21) has a cambered channel portion (21a) corresponding to said cambered heat pipe portion (51), and one rectilinear channel portion (21b) corresponding to one rectilinear heat pipe portion (52) and the other rectilinear channel portion (21c) corresponding to the other heat pipe portion (56). Thus, heat generated by the electronic component can be carried away from the set of fins to improve an integral performance to reduce noise and dissipate heat.

A groove (23) formed on said base (2) accommodates a thermal conductor (11) embedded into the base (2), said thermal conductor (11) is thermally connected to said evaporating portion of the first heat pipe (5) by an upper portion and thermally connected to the heat-generating electronic component by a lower portion; said thermal conductor (11) is made of copper plate with high thermal conductivity.

Advantages of Embodiments of the Invention

1. After said heat pipe (5) adapted to either said base (2) or said cover (3), the heat pipe (5) encircles most of said fan (4); while said evaporating portion is thermally connected to said electronic component, said condensing portion is kept distant from heat-generating electronic component. As the evaporating portion transfers heat to the condensing portion, said fan (4) is rotated to circulate cooling air into said set of fins to disperse heat. As a result, temperature can be lowered than ever to meet the requirements of new improved communication products.

2. Due to said heat pipe (5) is embedded into either said base (2) or said cover (3) to disperse heat through either the base (2) or the cover (3) directly. The fan (4) is not required to be rotated speedily, thus power can be saved, and noise can be reduced.

3. As a result, a thickness of each fin of said set of fins can be reduced; a space occupied by said communication products can be decreased. When assembled, a compact heat dissipating device will not affect any electronic components assembled to said communication products.

What is claimed is:

1. A heat dissipating device includes a housing (1) is formed with an exhaust (10) and an intake (33); a fan (4) disposed inside the housing (1) is corresponding to the intake (33); a set of fins (6) disposed inside the housing (1) is corresponding to the exhaust (10); said fan (4) is rotated to circulate cooling air into the set of fins (6) and expel hot air absorbed by the fins (6) from the exhaust (10); wherein an inner wall of the housing relative to the fan (4) is installed with a first heat pipe (5) with one end as one condensing portion encircles most of the fan (4) and the other end as the other condensing portion kept at an end of the housing distant from the fan (4) and thermally connected to the set of fins (6); while a middle portion of the heat pipe (5) served as an evaporating portion is placed on the inner wall of the housing (1), where a heat-generating electronic component is located, the middle portion of the heat pipe (5) is also thermally connected to the set of fins (6).

2. A heat dissipating device as claim 1 claimed, wherein said housing (1) consists of a base (2), and a cover (3) adapted to the base (2), an exhaust (10) is formed at the other end of the housing (1), an intake is formed at one end of the housing (1), a pair of cambered slots (20) formed through the base (2) are located below the fan (4); a channel (21) formed on an inner wall of said base (2) is corresponding to the heat pipe (5) and accommodates the first heat pipe (5) embedded into the base (2).

3. A heat dissipating device as claim 1 claimed wherein said condensing portion of the first heat pipe (5) which encircles most the fan (4) is a cambered heat pipe portion (51), the other condensing portion at the other end of the first heat pipe (5) is one rectilinear heat pipe portion (56) kept distant away from the fan (4), while said evaporating portion is the other rectilinear heat pipe portion (52) integrally connected to said cambered heat pipe portion (51), the other rectilinear heat pipe portion (52) is thermally connected to the heat-generating electronic component adjacent to the inner wall of the housing (1) and thermally connected to the set of fins (6); said channel (21) has a cambered channel portion (21a) corresponding to said cambered heat pipe portion (51), and one rectilinear channel portion (21b) corresponding to one rectilinear heat pipe portion (52) and the other rectilinear channel portion (21c) corresponding to the other heat pipe portion (56).

4. A heat dissipating device as claim 1 claimed wherein a groove (23) formed on said base (2) accommodates a thermal conductor (11) embedded into the base (2), said thermal conductor (11) is thermally connected between said evaporating portion of the first heat pipe (5) and the heat-generating electronic component; said thermal conductor (11) is made of copper plate.

* * * * *